United States Patent
Tirén et al.

(10) Patent No.: US 10,728,966 B1
(45) Date of Patent: Jul. 28, 2020

(54) CHIP TESTING METHOD AND AN APPARATUS FOR TESTING OF A PLURALITY OF FIELD EMISSION LIGHT SOURCES

(71) Applicants: Lightlab Sweden AB, Uppsala (SE); Nanyang Technological University, Singapore (SG)

(72) Inventors: Jonas Tirén, Uppsala (SE); Hilmi Volkan Demir, Singapore (SG); Vijay Kumar Sharma, Singapore (SG); Swee Tiam Tan, Singapore (SG)

(73) Assignees: Lightlab Sweden AB, Uppsala (SE); Nanyang Technological University, Singapore (SG)

( * ) Notice: Subject to any disclaimer, the term of this patent is extended or adjusted under 35 U.S.C. 154(b) by 0 days.

(21) Appl. No.: 16/486,860

(22) PCT Filed: Feb. 8, 2018

(86) PCT No.: PCT/SE2018/050115
§ 371 (c)(1),
(2) Date: Aug. 19, 2019

(87) PCT Pub. No.: WO2018/151645
PCT Pub. Date: Aug. 23, 2018

(30) Foreign Application Priority Data

Feb. 20, 2017 (SE) ........................................ 1750170
Mar. 1, 2017 (SE) ........................................ 1750222

(51) Int. Cl.
*H05B 41/392* (2006.01)
*H01J 63/02* (2006.01)
*G01R 31/44* (2020.01)

(52) U.S. Cl.
CPC ......... *H05B 41/3922* (2013.01); *G01R 31/44* (2013.01); *H01J 63/02* (2013.01)

(58) Field of Classification Search
CPC ............................. H05B 41/3922; G01R 31/44
See application file for complete search history.

(56) References Cited

U.S. PATENT DOCUMENTS

| 6,033,281 A | 3/2000 | Toro-Lira |
| 6,559,818 B1 * | 5/2003 | Browning ............ G01R 31/257 345/55 |
| 2002/0079802 A1 * | 6/2002 | Inoue ...................... H01J 3/022 313/309 |
| 2006/0261725 A1 | 11/2006 | Lee |
| 2012/0153808 A1 | 6/2012 | Yang et al. |

FOREIGN PATENT DOCUMENTS

EP  3035368 A1  6/2016

OTHER PUBLICATIONS

PCT International Search Report and Written Opinion dated Apr. 27, 2018 for International Application No. PCT/SE2018/050115, 14 pages.

* cited by examiner

*Primary Examiner* — Donald L Raleigh
(74) *Attorney, Agent, or Firm* — RMCK Law Group, PLC

(57) ABSTRACT

The present invention generally relates to a method for operating a plurality of field emission light sources, specifically for performing a testing procedure in relation to a plurality of field emission light sources manufactured in a chip based fashion. The invention also relates to a corresponding testing system.

16 Claims, 4 Drawing Sheets

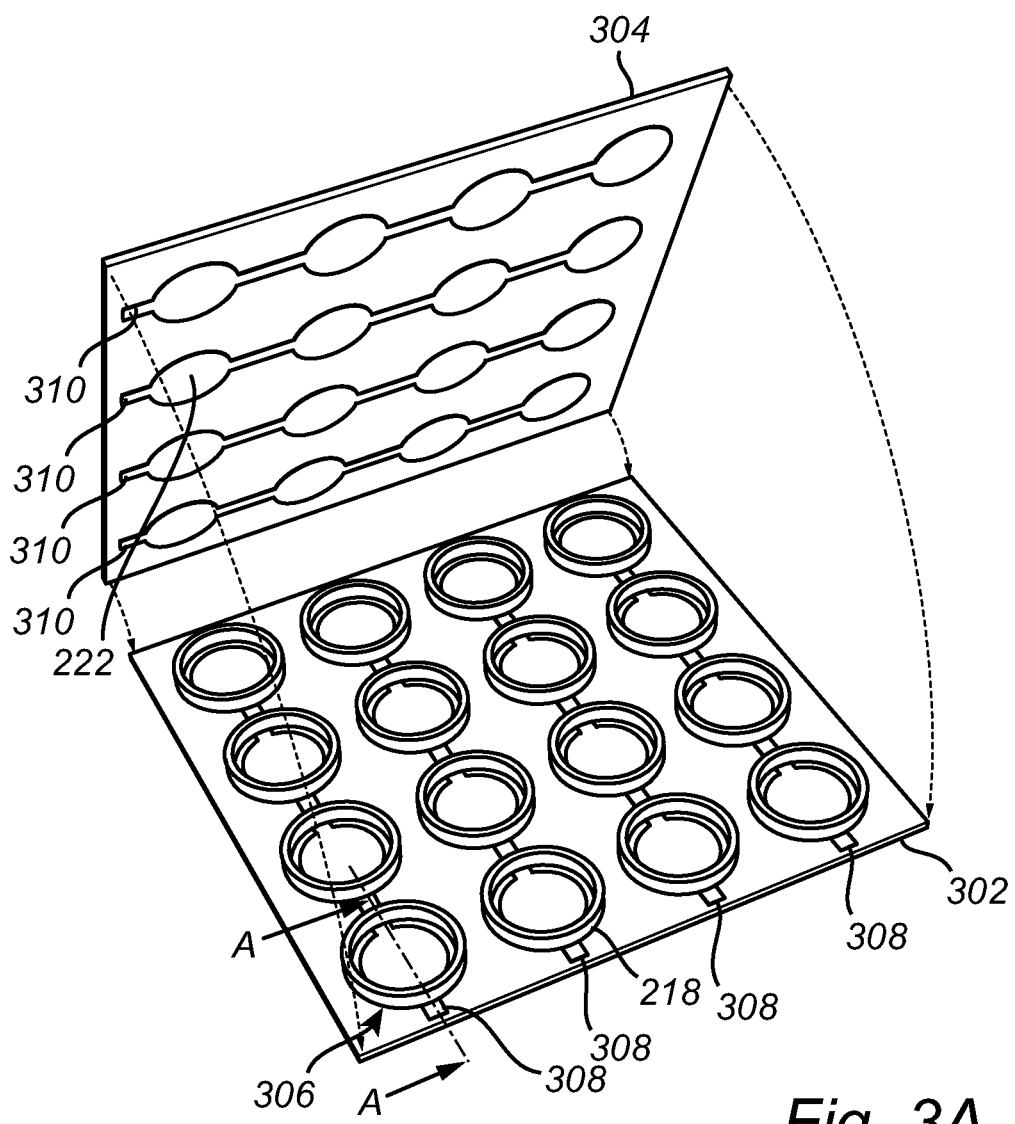
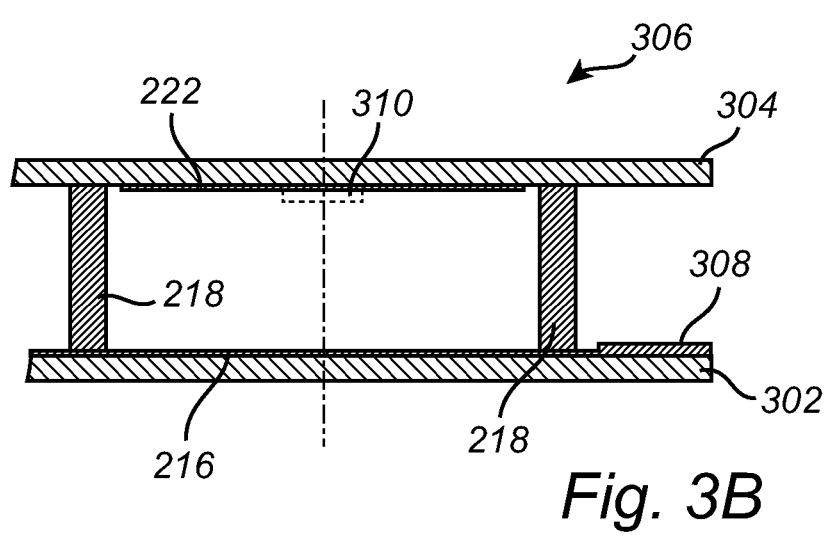
Fig. 3A
Fig. 3B

CHIP TESTING METHOD AND AN APPARATUS FOR TESTING OF A PLURALITY OF FIELD EMISSION LIGHT SOURCES

CROSS-REFERENCE TO RELATED APPLICATIONS

This application is a 371 U.S. National Stage of International Application No. PCT/SE2018/050115, filed Feb. 8, 2018, which claims priority to Swedish Patent Application No. 1750170-1, filed Feb. 20, 2017 and Swedish Patent Application No. 1750222-0, filed Mar. 1, 2017. The disclosures of each of the above applications are incorporated herein by reference in their entirety.

TECHNICAL FIELD

The present invention generally relates to a method for operating a plurality of field emission light sources, specifically for performing a testing procedure in relation to a plurality of field emission light sources manufactured in a chip based fashion. The invention also relates to a corresponding testing system.

BACKGROUND OF THE INVENTION

The technology used in modern energy saving lighting devices uses mercury as one of the active components. As mercury harms the environment, extensive research is done to overcome the complicated technical difficulties associated with energy saving, mercury-free lighting.

An approach used for solving this problem is to use field emission light source technology. Field emission is a phenomenon which occurs when a very high electric field is applied to the surface of a conducting material. This field will give electrons enough energy such that the electrons are emitted (into vacuum) from the material.

In prior art devices, a cathode is arranged in an evacuated chamber, typically being a bulb with glass walls, wherein the chamber on its inside is coated with an electrically conductive anode layer. Furthermore, a light emitting layer is deposited on the anode. When a high enough potential difference is applied between the cathode and the anode thereby creating high enough electrical field strength, electrons are emitted from the cathode and accelerated towards the anode. As the electrons strike the light emitting layer, typically comprising a light powder such as a phosphor material, the light powder will emit photons. This process is referred to as cathodoluminescence.

Recent advances in research and development within the area of field emission light sources have made it possible to miniaturize the field emission light source such that it may be manufactured as an in comparison small lighting chip rather than the prior-art bulb shaped field emission light source. An example of a chip based field emission light source is disclosed in WO2016096717, by the same applicant and incorporated in its entirety by reference.

In WO2016096717, the field emission light source is disclosed to be possible to be manufactured in large volumes at low cost using the concept of wafer level manufacturing, i.e. using a similar approach as used by IC's and MEMS. In accordance to WO2016096717, a plurality of field emission light sources each comprises a field emission cathode comprising a plurality of nanostructures formed, a spacer element and a cathodoluminescent anode, all arranged on the same wafer substrate.

Specifically, in accordance to WO2016096717 a large number of field emission light sources are manufactured at the same time on a large glass substrate also referred to herein as a wafer. A plurality of spacer element is subsequently placed so that each spacer element encompasses each field emission cathode with a certain minimum distance between the spacer element wall and the cathode. Lastly a plurality of small glass pieces (usually circular), containing the anodes, are sealed on to the spacers so that for each individual device a cavity is formed. This sealing is done under vacuum. In addition, a getter may be placed inside each cavity in order to maintain the vacuum level for prolonged periods of time. It should be noted that the position of the anode and the cathode in this short description is entirely interchangeable.

In all types of manufacturing it is necessary to perform various tests on each part to verify whether the operation of the part is correct, i.e. meeting a certain specification, or not. Therefore, quality control and test for multiple products is a significant issue, and thus forming a significant part of the cost for manufacturing. When manufacturing components/chips in large volume, it is of course of the highest relevance to optimize also the testing process. The testing process is mainly done in order to identify non-working devices and devices that are not operating to specification at an as early stage as possible to avoid spending further cost and effort on those. It also provides valuable feedback to the manufacturing processes done both prior and after this testing. A typical way of achieving this according to current art is to use a computerized test system which includes the appropriate parts to energize and the parts to be tested and measuring the performance. Typically, probes (needles), connected to a test system, are moved over the surface of the substrate to each device, lowered to make electrical contact with the device and the electrical (and optical if needed) test procedure is performed and the result is typically stored electronically. This method may also be adapted to test several devices in parallel by using multiple probes and may either multiplex the energizing and measuring procedure or use multiple parts in the test system to energize and measure the performance of several devices in parallel. This requires a mechanical movement of the probes in x, y and z directions with relively high speed and high precision. Such equipment is commonly available, but of course at a significant cost in both purchase and maintenance. Further common issues with this method are misalignment of probes, wear of probes, eventually causing contact problems.

Furthermore, in an end user application, there may be a need to use multiple light sources arranged adjacent to each other. Typically, this is simply done by taking individual devices and placing them as required in the application at hand. This will obviously require an electrical connection to each individual device and the individual devices must be separated by some distance for practical reasons, thus occupying further space. Furthermore, in order to simplify the electrical energizing, it is desirable that these multiple devices have quite similar electrical performance, i.e. operate with the same current and voltage. Therefore, devices may be selected for such similar performance.

Accordingly, there would be desirable to identify a process to be used in testing of a field emission light source, specifically manufactured in large volumes using wafer technology.

SUMMARY OF THE INVENTION

According to an aspect of the invention, the above is at least partly alleviated by a method of controlling a plurality of field emission light sources, each field emission light source comprising a cathode side including an electrical cathode connection and an oppositely arranged anode side including an electrical anode connection, wherein the method comprises arranging the plurality of field emission light sources in vicinity of each other in a matrix formation having m rows and n columns, where the electrical cathode connections for the field emission light sources are electrically connected to each other in line with the columns, and the electrical anode connections for the field emission light sources are electrically connected to each other in line with the rows, proving an electrical interface point for each of the m rows and the n columns, and applying a control signal to at least one of the electrical interface points at each of the m rows and to at least one of the electrical interface points at each of the n columns, thereby energizing at least one of the field emission light sources for emitting light.

In accordance to the present invention there is provided an improved operating procedure, where a plurality of field emission light sources for example may be tested individually or in groups, without the need to waste expensive wafer real state for individual electrical interface points for the plurality of field emission light sources. Rather, in accordance to the present invention the number of electrical interface points may be reduced, possibly to only one per each of the columns and the rows in which the field emission light sources are arranged in manufacturing. This is specifically apparent when the control signal is used for testing the field emission light sources, typically using a high voltage control signal to energize the light sources having a voltage level above 1 kV.

Accordingly, it is preferred to allow the field emission light sources to initially share at least a common wafer substrate in regards to their cathodes and or anodes (typically one cathode and anode per field emission light source), once the testing procedure has been concluded, the wafer substrate may be subdivided into sections comprising only a single field emission light source or a group of field emission light sources. By means of the present invention, the plurality of field emission light sources is arranged in vicinity of each other, preferably only having a separation there between that is below 1 mm, preferably around 0.2 mm. This separation will allow for enough spacing to allow for a suitable tool, such as a sawing blade or a laser arrangement for laser cutting, to be used in subdividing the field emission light sources.

In a preferred embodiment, the common wafer substrate allows for more than 100 field emission light sources to be manufactured at the same time, possibly even more, such as 200 or 300 or even further field emission light sources. As such, the matrix formation comprising m rows and the n columns will for example include m=10 rows and n=10 columns. In line with such an example there will thus be 10 columns with electrically connected electrical cathode connections and 10 rows with electrically connected electrical anode connections.

Preferably, the electrical interface points are arranged at an end portion of each of the m rows and the n columns. It may additionally be possible to a first electrical contact interface to the end portion of the rows and a second electrical contact interface to the end portion of the columns. As such, only two contact interfaces may need to be connected once to the plurality of field emission light sources for performing a full testing procedure.

In an embodiment only as single field emission light source is tested at a time. However, it may also be possible to test a group of field emission light sources at a time. Once a single or a group of field emission light sources has/have been tested, the testing procedure is continued for testing further light sources. As the plurality of field emission light sources are arranged in the mentioned matrix formation and the cathodes of each column are electrically connected and the anodes of each row are electrically connected, there is possible to form the test points for each of the columns and the rows at an end portion, giving easy access to connected the first and the second contact interfaces to the columns and rows, respectively.

Preferably, the testing procedure according to the invention further comprise acquiring, using a light sensor, an indication of a photonic output from the at least one energized field emission light source. It is preferred to store the indication of the photonic output for the tested single field emission light source or the group of field emission light sources. The indication of the voltage and current used, together with the photonic output is subsequently preferably used for sorting of the plurality of field emission light sources into different functionality "bins".

It may also be possible to include determining an operational status for the at least one energized field emission light source, with the inventive testing procedure. The operational status for the at least one energized field emission light source may for example comprises at least one of an operating voltage, an operating current, and operating power or an operational point for the at least one energized field emission light source. The operational status may be correlated with the indication of the photonic output for determining an overall status of the field emission light source, possibly subsequently used in subdividing the field emission light sources into "individuals" or groups of field emission light sources. Since individual devices adjacent to each other may typically have very similar electrical and optical characteristics, smaller groups may be identified, for example 2x2, 3x3 . . . 1x10 that may be subsequently divided in to such groups, as required by the end user application as discussed above. This will enable larger arrays and will thus save cost and space in the end user application.

In accordance to the present invention there is provided a system adapted for controlling a plurality of field emission light sources, wherein each field emission light source comprising a cathode side including an electrical cathode connection and an oppositely arranged anode side including an electrical anode connection, the plurality of field emission light sources being arranged in vicinity of each other in a matrix formation having m rows and n columns, where the electrical cathode connections for the field emission light sources are electrically connected to each other in line with the columns, and the electrical anode connections for the field emission light sources are electrically connected to each other in line with the rows, and at least one electrical interface point being arranged at each of the m rows and at least one interface point being arranged at each of the n columns, wherein the system comprises a first electrical contact adapted to be connected the at least one interface point of the m rows and a second electrical contact to be connected to the at least one interface point of the n columns, and means for applying a control signal to the first and the second electrical contact interface, thereby energizing at least one of the field emission light sources for emitting light. This aspect of the invention provides similar advantages as discussed above in relation to the previous aspect of the invention.

As indicated above, the system preferably, additionally, comprises a light sensor for generating an indication of a photonic output from at least one of the plurality of field emission light sources when energized, and means for acquiring, using the light sensor, the indication of the photonic output from the at least one energized field emission light source. This will further enhance the possibility of testing the plurality of field emission light sources.

It is preferred to, when the plurality of field emission light sources are arranged in the matrix formation, to select a separation between the plurality of field emission light sources is below 1 mm, preferably around 0.2 mm. This separation will allow for e.g. a sawing blade to have sufficient room with margin for disconnecting the plurality of field emission light sources from each other.

In the above description is has been pointed towards the possibility of making use of a common wafer substrate for the plurality of field emission light sources. In accordance to the invention it may also be possible to make use of a common anode substrate (possibly of glass). That is, it may be possible to use a single "large" glass substrate for the anodes, typically containing all the anodes and including means for sealing of the field emission light sources. This makes it possible to utilize the benefits of the wafer scale production fully. Another benefit of this approach is that it is now possible to avoid the use of through-hole electrical connection, commonly known as "vias". It may however also be possible to use individual anode structures for e.g. single field emission light sources or groups of field emission light sources. This may in some cases be preferable since such an arrangement may be subject to lower mechanical stress which may be important for example if different materials are used in the FEL device. In any case, this will be further elaborated below in the detailed description.

Further features of, and advantages with, the present invention will become apparent when studying the appended claims and the following description. The skilled addressee realize that different features of the present invention may be combined to create embodiments other than those described in the following, without departing from the scope of the present invention.

BRIEF DESCRIPTION OF THE DRAWINGS

The various aspects of the invention, including its particular features and advantages, will be readily understood from the following detailed description and the accompanying drawings, in which:

FIGS. 3A and 3B illustrates exemplary descriptions of an arrangement for wafer test according to the invention.

DETAILED DESCRIPTION

Figure 1:
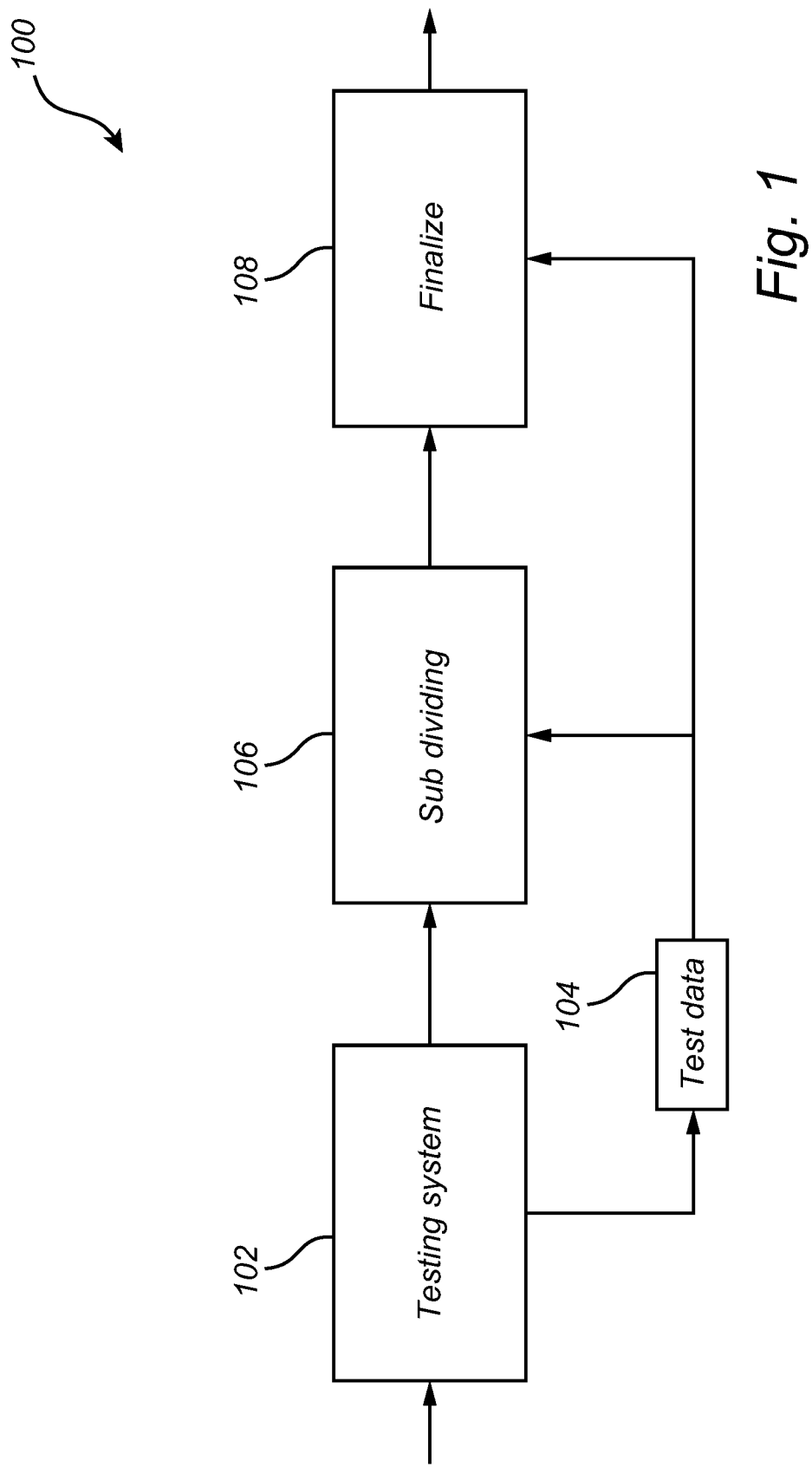
FIG. 1 illustrates a typical process flow for wafer test, sawing /dicing, encapsulation and final test.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled addressee. Like reference characters refer to like elements throughout.

Referring now to the drawings and to FIG. 1 in particular, there is illustrated a typical process flow 100 for wafer test, sawing/dicing, encapsulation and final test in order to put the invention into context. Once the manufacturing of a wafer containing multiple field emission light sources (FELs) has been completed, the wafer is to be tested, for example by a test system 102, and the parametric data such as for example operating voltage, current, power and optical output is measured, recorded and stored, as e.g. text data 104. Faulty and devices non-compliant to the desired specification are identified. After this the wafer is subdivided in a subdivision process 106, so that the devices are now single parts, or in case that a larger array shall be used, the subdivision takes this into account by the aid of the test data 104. The good FELs identified by the testing system 102 are picked out for further processing and the faulty parts are scrapped or sent to analysis. The good parts are then encapsulated, usually in a plastic package and electrical leads are attached so that the end user may contact the device electrically. Finally, the parts are tested again in a finalization process 108; the parametric data are again recorded, stored and possibly compared with the original test data 104, where-after the FELs are ready for packaging and shipment.

Figure 2A:
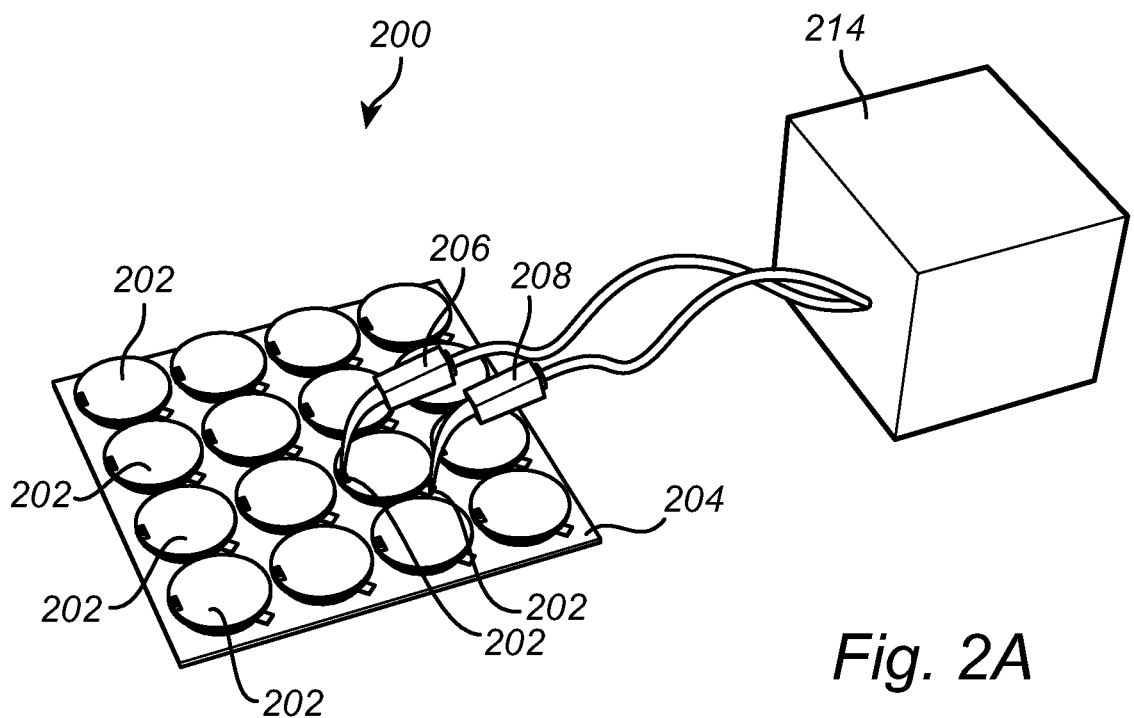
FIGS. 2A and 2B provide exemplary descriptions of an arrangement for wafer test according to prior-art.

In FIG. 2A there is illustrated a typical testing system 200 according to the prior-art. A plurality of FELs 202 is manufactured on a wafer 204. For simplicity and clarity, a small wafer containing only 16 individual FELs are shown. Much larger substrates, containing several hundreds of devices are entirely possible, as well as preferred. Wafer testing is done by contacting probes 206 and 208 to the electrical connection points, or pads 210 and 212, respectively. The pad 210 is in the illustration in electrical connection with a single cathode of the FEL 200 (as will be further elaborated in relation to FIG. 2B). In a corresponding manner, the pad 212 is in electrical connection with a single anode of the FEL 202. Accordingly, a pair of pads 210, 212, must be contacted with the pair of probes 206, 208 for testing a single FEL 202. Thus, the pads must be moved between testing a first to testing a second FEL 202, such as out of the 16 FEL 202 shown in FIG. 2A. As can be seen in FIG. 2A, it may be preferable to shift of at least one of the pads by 45 degrees in order to allow more space and easier probing. The probes 206, 208 are connected to an electrical control unit 214, typically energizing the FEL 202, measuring the parametric data and subsequently storing the data.

Figure 2B:
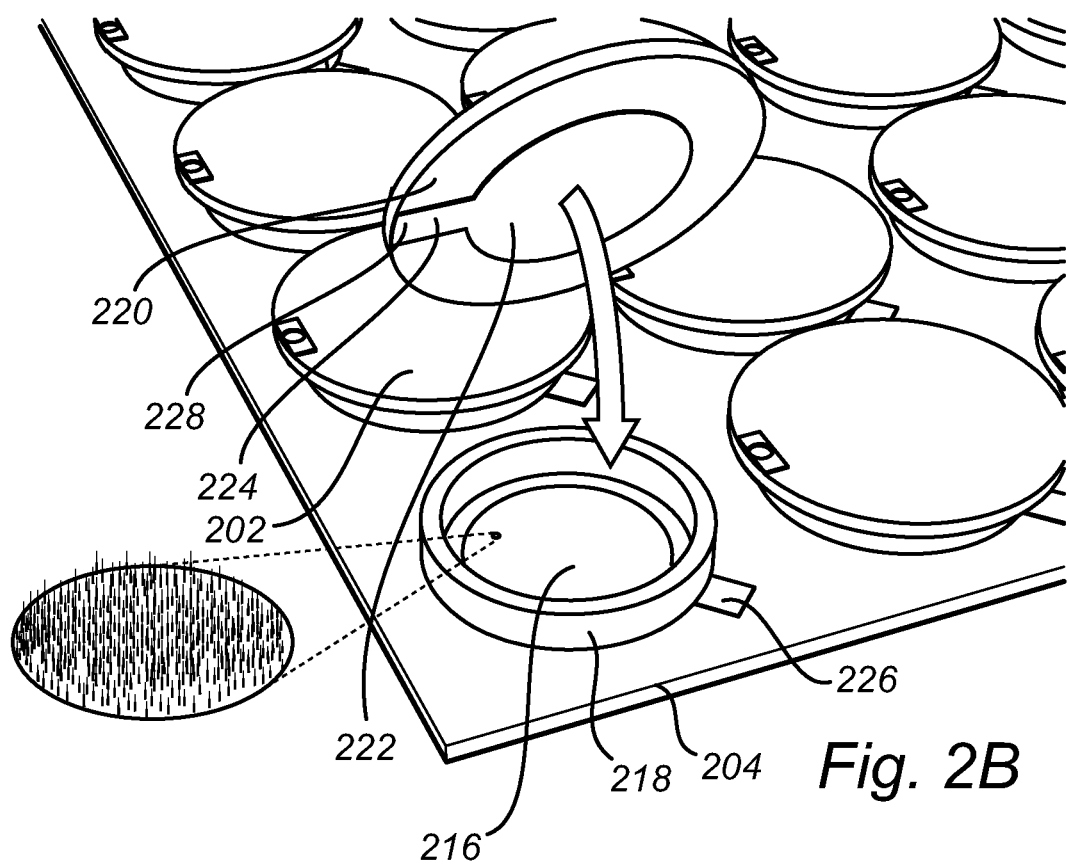

In FIG. 2B a typical partial view of a FEL device wafer is shown according to the prior-art. The individual FELs 202 are built on the substrate wafer 204 by attaching or forming a cathode 216, a spacer 218 and a top glass disk 220 also being the carrier of a field emission anode 222. A detailed view of the cathode 216 is provided, typically comprising a plurality of nanostructures, for example formed from ZnO or carbon nanotubes.

The glass disc 220 must overlap the spacer 218, typically by 1 mm in order to allow for accumulated alignment uncertainties as well as making it possible to achieve an electrical contact. As mentioned above, conducting paths are provided from the anode 222 to the pad 210 and from the cathode 216 to the pad 212. In this specific example, an electrical via connection 228 is used to make the connection to the top pad 210 at the top glass disk 220 so that it may easily be probed. The electrical via connection 228 is preferably made outside the cavity area (i.e. outside of the spacer 218) as well as the seal area to minimize unwanted leakage of gaseous species. The distance between the individual FELs 202 must be large enough to allow for final separation. In a typical prior-art embodiment, 0.2 mm has been used. It is possible that this distance must be larger since, in this arrangement in inaccuracy of placement of the top glass discs must be accounted for. Such an uncertainty will only elevate the benefits of the proposed invention.

FIG. 3A illustrates exemplary descriptions of an arrangement for wafer test according to the present invention. In FIG. 3A, two glass substrates 302 and 304 are joined together forming multiple individual FELs 306. The spacers 218 and the anodes 222 may also be seen. At the edges of the substrates 302, 306, pads 308 and 310 may in accordance to the present invention now connecting to the anode rows and cathode columns respectively. In comparison to the illustration provided in FIGS. 2A and 2B, where the pads are shifted 45 degrees, in FIG. 3A the shift is 90 degrees. It should be understood that it of course may be possible to select any angular degree of shift, for example dependent on the intended type of electrical contact interface to be used in the testing process.

It should be specifically noted that it in accordance to an alternative aspect may be possible to arrange the electrical cathode connections for the field emission light sources to be electrically connected to each other in line with the columns, but to still keep the anodes as separate elements. This will make it possible to provide a single interface to all of the cathodes at the end of the wafer, while still having to individually probing/connecting to the anodes as those are provided as "separate unconnected islands".

FIG. 3B shows a partial cross section along the axis A-A in FIG. 3A. The individual FELs 306 are built on the substrate 302 by attaching cathodes 216 (possibly similar to what is shown in FIG. 2B), spacers 218 and the top glass substrate glass 304 also being the carrier of the anodes 222. Electrical connections are arranged in a continuous line to the edge of the substrates 302 where the pads 308 are formed, for a column of cathodes 216. Similarly, electrical connections are arranged in a continuous line to the edge of the substrates 304 where the pads 310 are formed, for a row of anodes 222. Again a distance must be used in order to accommodate the subdividing (e.g. sawing) of the substrates 302, 304 to form individual FELs 306. From FIG. 3B it is easy to realize that probes are preferably omitted entirely and replaced by multiple connection contact (as described earlier) inserted into the slots between the substrates 304 and 306 to make contact with all the rows and columns respectively at the same time, using suitable electrical contact interfaces.

An exemplary comparison on device area savings is shown in Table 1 below. It is advantageous to make the devices in a circular fashion as avoiding corners and sharp edges often is beneficial when dealing with high electrical fields in order to avoid parasitic currents and arcing phenomena.

The active device area is set by the anode area and the desire power output in combination with the desired anode lifetime (by intensity degradation). In this example 1cm$^2$ has been used. The anode must have a certain distance to the inner wall of the spacer element, in these examples set to 1 mm. The spacer width is typically 1 mm.

TABLE 1

|  | Prior art implementation | Present disclosure |  |
| --- | --- | --- | --- |
| Anode area | 1.00 | 1.00 | cm2 |
| Anode radius | 5.65 | 5.65 | mm |
| Anode - sidewall distance | 1.00 | 1.00 | mm |
| Spacer width | 1.00 | 1.00 | mm |
| Glass disc overlap | 1.00 | 0.00 | mm |
| Saw street | 0.10 | 0.10 | mm |

TABLE 1-continued

|  | Prior art implementation | Present disclosure |  |
| --- | --- | --- | --- |
| Total radius | 8.75 | 7.75 | mm |
| Device diameter | 17.50 | 15.50 | mm |
| Devices per 300 × 300 mm wafer | 256 | 324 |  |

When using top glass discs, an overlap outside the sealing spacer must be present in order to accommodate the contact structure, also in the case using a via. The sawing blade must have room with margin; 0.2 mm (i.e. 2 × 0.1 mm) should be sufficient using state of the art sawing equipment.

The end result is that on an exemplary substrate wafer size of 300 × 300 mm the total possible devices is increased from 256 to 324 devices, providing an increase of 27% in regards to devices.

Figure 4:
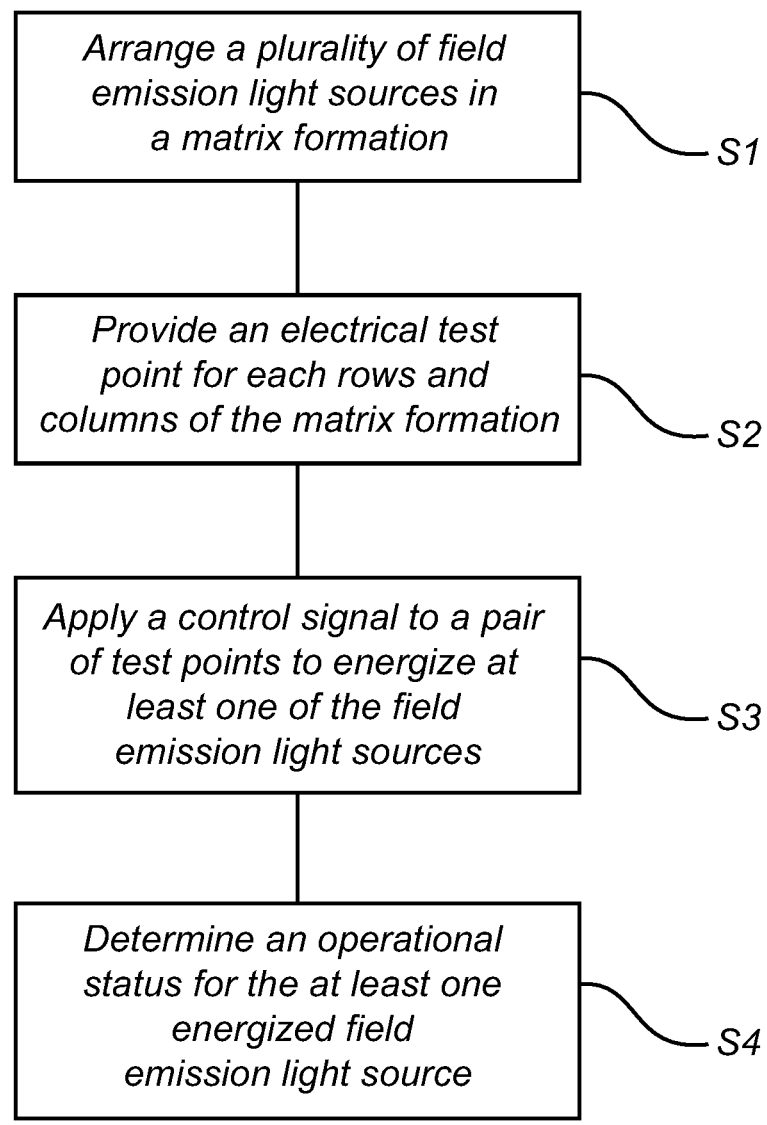
FIG. 4 shows a flow chart of a method according to an embodiment of the invention.

In accordance to the present invention and in line with FIG. 4, there is provide a method of performing functionality testing of a plurality of field emission light sources, each field emission light source comprising a cathode side including an electrical cathode connection and an oppositely arranged anode side including an electrical anode connection, wherein the method comprises arranging, S1, the plurality of field emission light sources in vicinity of each other in a matrix formation having m rows and n columns, proving, S2, an electrical test point for each of the m rows and the n columns, and applying, S3, a control signal to at least one of the electrical test points at each of the m rows and to at least one of the electrical test points at each of the n columns, thereby energizing at least one of the field emission light sources for emitting light. Preferably, the method further comprises determining, S4, an operational status for the at least one energized field emission light source.

In comparison to prior-art solutions for performing functionality testing of a plurality of field emission light sources the presently suggested approach will be greatly simplified.

Although the figures may show a specific order of method steps, the order of the steps may differ from what is depicted. In addition, two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps. Additionally, even though the invention has been described with reference to specific exemplifying embodiments thereof, many different alterations, modifications and the like will become apparent for those skilled in the art.

Variations to the disclosed embodiments can be understood and effected by the skilled addressee in practicing the claimed invention, from a study of the drawings, the disclosure, and the appended claims. Furthermore, in the claims, the word "comprising" does not exclude other elements or steps, and the indefinite article "a" or "an" does not exclude a plurality.

The invention claimed is:

1. A method of controlling a plurality of field emission light sources, each field emission light source comprising a cathode side including an electrical cathode connection and an oppositely arranged anode side including an electrical anode connection, wherein the method comprises:

arranging the plurality of field emission light sources in vicinity of each other in a matrix formation having m rows and n columns, where the electrical cathode connections for the field emission light sources are electrically connected to each other in line with the columns, and the electrical anode connections for the field emission light sources are electrically connected to each other in line with the rows, providing an electrical interface point for each of the m rows and the n columns, applying a control signal to at least one of the electrical interface points at each of the m rows and to at least one of the electrical interface points at each of the n columns, thereby energizing at least one of the field emission light sources for emitting light, acquiring, using a light sensor, an indication of a photonic output from the at least one energized field emission light source, determining an operational status for the at least one energized field emission light source based on the indication of the photonic output from the at least one energized field emission light source, and separating the field emission light sources from each other, wherein the separation is based on the operational status for the at least one energized field emission light source.

2. The method according to claim 1, wherein the separation is controlled further based on the photonic output of field emission light sources.

3. The method according to claim 1, further comprising:
subsequently applying the control signal to at least another one of the electrical interface points at the m rows or the n columns, thereby energizing at least another one of the field emission light sources for emitting light.

4. The method according to claim 1, further comprising:
storing the indication of the photonic output emitted by the at least one energized field emission light source.

5. The method according to claim 1, wherein the anode side is shared between at least two of the plurality of field emission light sources.

6. The method according to claim 1, wherein determining of the operational status for the at least one energized field emission light source comprises determining at least one of an operating voltage, an operating current, and operating power or an operational point for the at least one energized field emission light source.

7. The method according to claim 6, wherein the determined operational status is used for sorting of the plurality of field emission light sources into different functionality bins.

8. The method according to claim 1, wherein a predetermined number of field emission light sources are energized at the same time.

9. The method according to claim 8, wherein a single field emission light sources is energized at a time.

10. The method according to claim 8, wherein a group of field emission light sources are energized at a time.

11. The method according to claim 1, wherein the control signal is a high voltage control signal having a voltage level above 1 kV.

12. The method according to claim 1, wherein the electrical interface point is arranged at an end portion of each of the m rows and the n columns.

13. The method according to claim 12, further comprising arranging a first electrical contact to the electrical interface points of the rows and a second electrical contact to the electrical interface points of the columns.

14. The method according to claim 1, wherein the anode side is individual for each of the plurality of field emission light sources.

15. A system adapted for controlling a plurality of field emission light sources, wherein:
each field emission light source comprising a cathode side including an electrical cathode connection and an oppositely arranged anode side including an electrical anode connection, the plurality of field emission light sources being arranged in vicinity of each other in a matrix formation having m rows and n columns, where the electrical cathode connections for the field emission light sources are electrically connected to each other in line with the columns, and the electrical anode connections for the field emission light sources are electrically connected to each other in line with the rows, and at least one electrical interface point being arranged at each of the m rows and at least one interface point being arranged at each of the n columns, wherein the system comprises:

a first electrical contact adapted to be connected the at least one interface point of the m rows and a second electrical contact to be connected to the at least one test point of the n columns, and means for applying a control signal to the first and the second electrical contacts, thereby energizing at least one of the field emission light sources for emitting light, wherein the system is further adapted to:

acquire, using a light sensor comprised with the system, an indication of a photonic output from the at least one energized field emission light source, determine an operational status for the at least one energized field emission light source, and separate the field emission light sources from each other, wherein the separation is based on the operational status for the at least one energized field emission light source.

16. The system according to claim 15, wherein when the plurality of field emission light sources are arranged in the matrix formation, to select a separation between the plurality of field emission light sources is below 0.3 mm, preferably around 0.2 mm.

* * * * *